(12) United States Patent
Hautala

(10) Patent No.: US 7,968,422 B2
(45) Date of Patent: Jun. 28, 2011

(54) METHOD FOR FORMING TRENCH ISOLATION USING A GAS CLUSTER ION BEAM GROWTH PROCESS

(75) Inventor: John J. Hautala, Beverly, MA (US)

(73) Assignee: TEL Epion Inc., Billerica, MA (US)

( * ) Notice: Subject to any disclaimer, the term of this patent is extended or adjusted under 35 U.S.C. 154(b) by 0 days.

(21) Appl. No.: 12/367,697

(22) Filed: Feb. 9, 2009

(65) Prior Publication Data

US 2010/0200946 A1    Aug. 12, 2010

(51) Int. Cl.
*H01L 21/76* (2006.01)

(52) U.S. Cl. .. 438/424; 438/435; 438/437; 257/E21.546

(58) Field of Classification Search .................. 438/424, 438/435, 437, 440, 439; 257/E21.546
See application file for complete search history.

(56) References Cited

U.S. PATENT DOCUMENTS

| | | | |
|---|---|---|---|
| 4,152,478 A | 5/1979 | Takagi | |
| 4,361,762 A | 11/1982 | Douglas | |
| 4,740,267 A | 4/1988 | Knauer et al. | |
| 4,886,971 A | 12/1989 | Matsumura et al. | |
| 4,916,311 A | 4/1990 | Fuzishita et al. | |
| 6,124,620 A | 9/2000 | Gardner et al. | |
| 6,218,207 B1 | 4/2001 | Itoh et al. | |
| 6,635,883 B2 | 10/2003 | Torti et al. | |
| 6,797,339 B2 * | 9/2004 | Akizuki et al. | 427/562 |
| 7,060,989 B2 | 6/2006 | Swenson et al. | |
| 7,173,252 B2 | 2/2007 | Mack | |
| 2002/0014407 A1 | 2/2002 | Allen et al. | |
| 2002/0130275 A1 | 9/2002 | Mack et al. | |
| 2003/0132471 A1 | 7/2003 | Matsui et al. | |
| 2005/0155951 A1 | 7/2005 | Suzuki et al. | |
| 2006/0124934 A1 | 6/2006 | Fukumiya et al. | |
| 2007/0099380 A1 | 5/2007 | Kim | |
| 2007/0184655 A1 * | 8/2007 | Learn et al. | 438/687 |
| 2007/0210366 A1 * | 9/2007 | Sandhu et al. | 257/305 |
| 2007/0224824 A1 | 9/2007 | Chen et al. | |
| 2008/0149826 A1 | 6/2008 | Renau et al. | |
| 2009/0152629 A1 | 6/2009 | Hu et al. | |

FOREIGN PATENT DOCUMENTS

| | | |
|---|---|---|
| JP | 62296357 A | 12/1987 |
| JP | 06275545 | 9/1994 |
| WO | 0170378 A1 | 9/2001 |
| WO | 0184612 A1 | 11/2001 |

OTHER PUBLICATIONS

Isao Yamada et al., "Materials Processing by Gas Cluster Ion Beams", Materials Science and Engineering Reports, vol. 34, Issue 6, pp. 231-295, Oct. 30, 2001 (ISSN 09S7-796X).

Saitoh, Y. et al, Acceleration of cluster and molecular ions by TIARA 3 MV tandem accelerator, vol. 452, No. 1-2, Sep. 21, 2000, pp. 61-66, XP004210610, ISSN: 0168-9002.

(Continued)

*Primary Examiner* — Michael Trinh
(74) *Attorney, Agent, or Firm* — Wood, Herron & Evans, LLP

(57) ABSTRACT

A method of forming shallow trench isolation on a substrate using a gas cluster ion beam (GCIB) is described. The method comprises generating a GCIB, and irradiating the substrate with the GCIB to form a shallow trench isolation structure by growing a dielectric layer in at least one region on the substrate.

19 Claims, 8 Drawing Sheets

OTHER PUBLICATIONS

Yamada, I. et al., Surface modification with gas cluster ion beams, Nuclear Instruments & Methods in Physics Research, vol. B79, Nov. 2, 1992, pp. 223-226, XP001031961, ISSN: 0168-583X.

Park et al., Evolution of Residual Stress in Plasma-enhanced Chemical-Vapor-Deposited Silicon Dioxide Film Exposed to Room Air, Applied Physics Letters, Dec. 13, 1999, pp. 3811-3813, vol. 75, No. 24.

Nguyen, S. V., High-density Plasma Chemical Vapor Deposition of Silicon-based Dielectric Films for Integrated Circuits, J. Res. Develop., Jan./Mar. 1999, pp. 109-126, vol. 43, No. 1/2.

Witvrouw et al., A Comparison Between Wet HF Etching and Vapor HF Etching for Sacrificial Oxide Removal, SPIE vol. 4174 (2000), pp. 130-141.

Baker, S.H. et al., The construction of a gas aggregation source for the preparation of size-selected nanoscale transition metal clusters; Review of Scientific Instruments, AIP, Aug. 1, 2000, pp. 3178-3183, vol. 71, No. 8, XP012038462, ISSN: 0034-6748, Melville, NY.

European Patent Office, International Search Report and Written Opinion issued in related International Application PCT/US2010/020612 dated Apr. 20, 2010, 12 pp.

Toyoda, N. et al., High Quality Optical Thin Film Formation with Low Energy Gas Cluster Ion Beam Irradiation, 14th Int'l Conference on Ion Implantation Technology Proceedings, IEEE, 2003, pp. 701-704, Piscataway, NJ.

European Patent Office, Search Report and Written Opinion issued in corresponding International Application No. PCT/US2010/022061, dated Aug. 30, 2010, 12 pp.

Hautala, J., et al., "Infusion Processing: An Alternative to Plasma Technology for Semiconductor Device Manufacturing", Proceedings of the Electrochemical Society, Symposium on ULSI Process Integration IV (Quebec PR, Canada, May 16-20, 2005), 2005, vol. 6, pp. 118-130.

Shao et al., "Nitrogen gas-cluster ion beam—A new nitrogen source for GaN growth", Mat. Res. Soc. Symp. Proc., 2003, vol. 743, pp. 97-102.

U.S. Patent and Trademark Office, Non-final Office Action issued in related U.S. Appl. No. 12/145,199 dated Oct. 22, 2010, 25 pp.

U.S. Patent and Trademark Office, Non-final Office Action issued in related U.S. Appl. No. 12/145,199 dated Mar. 25, 2011, 16 pp.

* cited by examiner

METHOD FOR FORMING TRENCH ISOLATION USING A GAS CLUSTER ION BEAM GROWTH PROCESS

CROSS-REFERENCE TO RELATED APPLICATIONS

This application is related to co-pending U.S. patent application Ser. No. 12/145,199, entitled METHOD FOR FORMING TRENCH ISOLATION, filed on Jun. 24, 2008. The entire content of this application is herein incorporated by reference in its entirety.

BACKGROUND OF THE INVENTION

1. Field of Invention

The invention relates to a method for forming a dielectric layer using a gas cluster ion beam (GCIB), and more particularly to a method for forming a dielectric layer using a GCIB growth process.

2. Description of Related Art

Implementing electronic circuits involves connecting isolated devices or circuit components through specific electronic paths. In silicon-based integrated circuit (IC) fabrication, it is necessary to isolate devices that are formed in a single substrate from one another. The individual devices or circuit components subsequently are interconnected to create a specific circuit configuration.

As the density of the devices continues to rise, parasitic inter-device currents become more problematic. Isolation technology, therefore, has become an important aspect of IC fabrication. For example, dynamic random access memory (DRAM) devices generally comprise an array of memory cells for storing data and peripheral circuits for controlling data in the memory cells. Each memory cell in a DRAM stores one bit of data and consists of one transistor and one capacitor. Within the array, each memory cell must be electrically isolated from adjacent memory cells. The degree to which large numbers of memory cells can be integrated into a single IC chip depends, among other things, on the degree of isolation between the memory cells. Similarly, in metal-oxide-semiconductor (MOS) technology, isolation must be provided between adjacent devices, such as NMOS or PMOS transistors or CMOS circuits, to prevent parasitic channel formation.

Shallow trench isolation (STI) is one technique that can be used to isolate devices such as memory cells or transistors from one another. The typical STI process consists of a blanket pad oxide, and a blanket silicon nitride followed by a trench mask and etch through the silicon nitride and pad oxide, and into the underlying crystalline silicon substrate. The mask is stripped and a liner oxide is grown and annealed. Next, high density plasma (HDP) oxide is deposited to fill the trench and again heated to Denny the deposited oxide. Finally, the HDP oxide overburden is polished back to the buried silicon nitride and the silicon nitride/pad oxide is stripped prior to gate oxidation. As the HDP fills the trench it forms a vertical seam where the deposited layers of the HDP begin to join to fill the trench.

During the high temperature processing at liner oxide anneal and HDP oxide densification, stresses can develop because of non-uniform heating of the substrate. Within the active region, these stresses can modify the transistor performance. At the substrate level, non-uniformity of stress can cause localized overlay registration errors during the gate masking process. In addition, during the mechanical planarization, this seam of the HDP is more vulnerable to over-etching as compared to the adjacent HDP layer. As a result, a defect can be created at the seam that can lead to operational problems for the device.

Accordingly, it is desirable to improve the trench isolation techniques to address those and similar problems.

SUMMARY OF THE INVENTION

The invention relates to a method for forming a dielectric layer using a gas cluster ion beam (GCIB), and more particularly to a method for forming a dielectric layer using a GCIB growth process.

The invention further relates to a method for forming a dielectric layer for trench isolation on a substrate using a GCIB.

According to one embodiment, a method of forming shallow trench isolation on a substrate is described. The method comprises: generating a GCIB; and irradiating the substrate with the GCIB to form a shallow trench isolation (STI) structure by growing a dielectric layer in at least one region on the substrate.

According to another embodiment, an integrated circuit is described. The integrated circuit comprises: a semiconductor substrate including a first region; a plurality of active regions in the first region; and an STI structure separating at least two of the active regions, wherein the STI structure includes a dielectric trench having a dielectric liner formed by growing the dielectric liner on the semiconductor substrate using a GCIB.

According to another embodiment, an STI structure of a semiconductor structure is described. The STI structure contains a dielectric material having a seam therein, wherein the dielectric material adjacent the seam is densified with one or more species introduced into an upper surface of the dielectric material using a GCIB.

According to another embodiment, a memory device is described. The memory device comprises: a semiconductor substrate including a first region; a plurality of active regions provided in the first region; an STI structure separating at least two of the active regions, wherein the STI structure includes a dielectric trench having a dielectric liner formed by growing the dielectric liner on the semiconductor substrate using a GCIB; and one or more species introduced into a surface of the dielectric trench using another GCIB, wherein the one or more species extend into the dielectric trench to a depth ranging from about 30 nm to about 80 nm.

According to yet another embodiment, an electronic system is described. The electronic system comprises: a controller; and a memory device coupled to the controller, wherein the memory device comprises an array of memory cells. The memory cells comprise: a semiconductor substrate including a first region; a plurality of active regions in the first region; and an STI structure comprising a dielectric trench having a dielectric liner that separates the active regions, wherein the dielectric liner is formed by growing the dielectric liner on the semiconductor substrate using a GCIB, and wherein the dielectric trench is densified with one or more species introduced into an upper surface of the dielectric trench using another GCIB.

DETAILED DESCRIPTION OF SEVERAL EMBODIMENTS

Figure 1A:
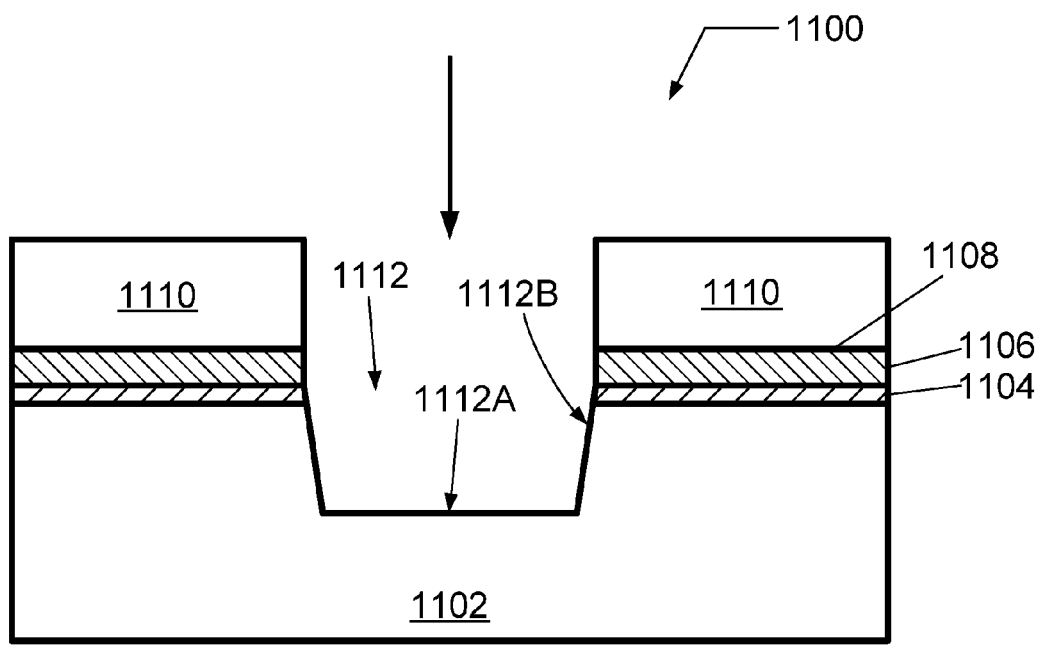
FIGS. 1A through 1D illustrate a cross-sectional view of an exemplary portion of an STI structure according to an embodiment of the method.

A method and system for preparing a dielectric layer on a substrate using a gas cluster ion beam (GCIB) is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

According to several embodiments, methods of forming shallow trench isolation on a substrate are described. These methods include generating a GCIB, and irradiating the substrate with the GCIB to form a shallow trench isolation (STI) structure. A GCIB is generated and the GCIB is used to grow a dielectric layer in the substrate to a pre-determined depth. One or more species may be introduced to the dielectric layer. Further, the dielectric material with the introduced species may be densified through an annealing process.

A GCIB comprises gas clusters characterized by nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion.

The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. GCIBs can be formed by the condensation of individual gas atoms (or molecules) during the adiabatic expansion of high pressure gas from a nozzle into a vacuum. A skimmer with a small aperture strips divergent streams from the core of this expanding gas flow to produce a collimated beam of clusters. Neutral clusters of various sizes are produced and held together by weak inter-atomic forces known as Van der Waals forces. Thereafter, gas clusters in the gas cluster beam are ionized (e.g., by stripping one or more electrons) to form the GCIB.

"Substrate" or "substrate assembly" as used herein refers to a semiconductor substrate such as a base semiconductor layer or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as capacitor plates or barriers for capacitors.

"Layer" as used herein can refer to a layer formed on a substrate using a deposition process. The term "layer" is meant to include layers specific to the semiconductor industry, such as "barrier layer," "dielectric layer," and "conductive layer." (The term "layer" is synonymous with the term "film" frequently used in the semiconductor industry). The term "layer" is also meant to include layers found in technology outside of semiconductor technology, such as coatings on glass.

Referring to FIG. 1A, a cross-sectional view of an exemplary portion of an STI structure 1100 is shown according to an embodiment. The STI structure 1100 includes a substrate 1102 that may be a silicon-containing structure or other semiconductor substrate that includes a bulk substrate region. For ease of illustration, the figures show active areas and STI field isolation regions in a single well type. However, in general, this and other embodiments are applicable to other semiconductor device isolation regions such as n-well and p-well regions in p-type substrates, n-type substrates and epitaxial substrates, including p on p+, p on p−, n on n+, and n on n− depending on the type of semiconductor device being manufactured. In some implementations, the substrate 1102 can comprise gallium arsenide (GaAs) or other semiconductor materials including, but not limited to: Si, Ge, SiGe, GaAs, InAs, InP, CdS, CdTe, other III/V compounds, and the like.

A layer of a pad oxide 1104, such as $SiO_2$, can be provided atop the substrate 1102, for example, either by deposition or by oxidizing process(es). In the latter, oxidation may include heating the substrate 1102 in an oxygen ambient at high temperature (e.g., 800 degrees C. to about 1100 degrees C.) until the oxide is formed on the surface of the substrate 1102. It is also possible to form pad oxide layer 1104 by conventional deposition processes such as, but not limited to: chemical vapor deposition (CVD), plasma-enhanced CVD (PECVD), or physical vapor deposition (PVD). Further, it is possible to form pad oxide layer 1104 using a GCIB to perform an oxidation process and grow the pad oxide layer 1104.

A stop layer 1106, such as a nitride (e.g., $SiN_x$) layer, a carbide (e.g., $SiC_x$) layer, an oxynitride (e.g., $SiO_xN_y$) layer, a carbonitride (e.g., $SiC_xN_y$) layer, or other dielectric layer, which resists erosion during subsequent planarization and etching, is provided over the pad oxide layer 1104 and defines an outer surface 1108. A mask 1110, such as a layer of photoresist, then is deposited and patterned as shown. The mask 1110 can be patterned by conventional photolithographic techniques. Other materials and additional layers may also be used to form the mask 1110 without departing from these and other embodiments.

Mask 1110 is patterned to expose regions for forming a trench 1112. By trench, it is meant to include any recessed contour, such as a hole, groove, and the like. Moreover, by substrate, it is meant to include any semiconductor layer, and by substrate assembly, it is meant to include any substrate having one or more layers formed thereon or doped regions formed therein.

The stop layer 1106 and the pad oxide layer 1104 exposed through the mask 1110 can then be removed. Suitable techniques for patterning these layers include, but are not limited to, dry etching techniques and wet etching techniques. Dry etching techniques may include dry etching, wet etching, dry plasma etching, ion beam etching, GCIB etching, etc. The etching process, indicated by the arrow, may continue through these layers to remove at least a portion of the substrate 1102 in forming the trench 1112. The depth that etching is performed into the substrate 1102 to form the trench 1112 is typically from about 10 nm (nanometers) to about 1000 nm. As will be appreciated, however, other depths may be required depending upon the desired aspect ratio (i.e., depth to width) of the opening into the substrate 1102. An anisotropic etch such as a plasma or reactive ion etch (RIE) process can be used as the dry etching process. The mask 1110 may then be removed by wet or dry stripping of the photoresist using conventional techniques, either before growing the dielectric layer, or thereafter as shown below.

Figure 1B:
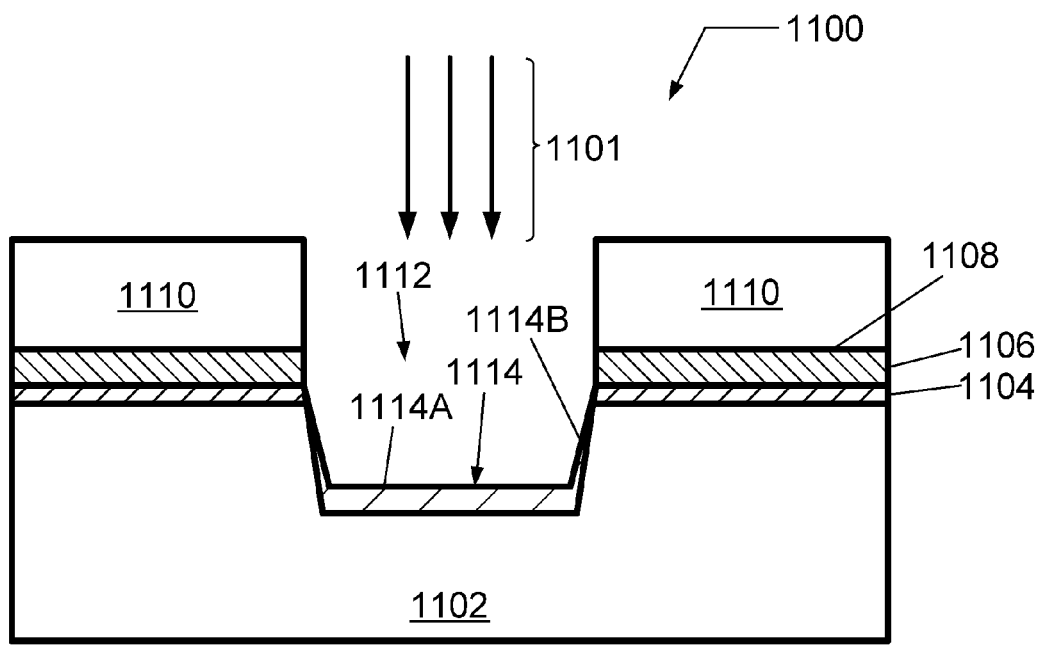

Referring to FIG. 1B, a cross-sectional view of an exemplary portion of the STI structure 1100 depicted in FIG. 1A is shown during a step of growing a dielectric layer 1114 at the base of trench 1112. A GCIB 1101 is generated, and the substrate 1102, or one or more layers on the substrate 1102, is irradiated with the GCIB 1101 to form dielectric layer 1114. The GCIB 1101 is used to grow dielectric layer 1114 in at least one region on the substrate 1102 to a pre-determined depth. The dielectric layer 1114 may include a bottom portion 1114A formed on a bottom 1112A of trench 1112, and may optionally include a sidewall portion 1114B formed on sidewalls 1112B of trench 1112. The dielectric layer 1114 may serve as a dielectric liner in trench 1112. The dielectric layer 1114 may comprise an oxide, such as $SiO_2$ or more generally $SiO_x$. Alternatively, the dielectric layer 1114 may comprise a nitride, such as $SiN_x$ or the dielectric layer 1114 may comprise an oxynitride, such as $SiO_xN_y$. When the substrate 1102, or the irradiated layer or layers on substrate 1102, comprises silicon, $SiO_2$, $SiN_x$, or $SiO_xN_y$ may be grown via the GCIB 1101 by using an oxygen-containing gas and/or nitrogen-containing gas, such as $O_2$, $N_2$, $N_2O$, $NO_2$, or $NO$. Furthermore, other materials may be introduced as well, e.g., carbon may be introduced to form a carbide using a carbon-containing gas, such as $CH_4$. Additional details for growing a thin film or layer, using, for example, an oxidation process, are provided in co-pending U.S. patent application Ser. No. 12/144,968, entitled METHOD AND SYSTEM FOR GROWING A THIN FILM USING A GAS CLUSTER ION BEAM. The entire content of this application is herein incorporated by reference in its entirety.

The GCIB 1101 may be formed using a GCIB processing system as discussed below.

The GCIB 1101 may be formed and accelerated by an acceleration potential ranging from about 1 kV to about 70 kV. Alternatively, the acceleration potential may range from about 1 kV to about 20 kV. In one embodiment, the acceleration potential is selected based upon the desired depth for the dielectric layer 1114. Alternatively, or in addition, the selection of the acceleration potential may be made based upon the type of layer(s) adjacent the dielectric layer 1114. A beam acceleration potential and a beam dose are selected to achieve a thickness of the thin film ranging up to about 300 angstroms and to achieve a surface roughness of an upper surface of the thin film that is less than about 20 angstroms. The GCIB is accelerated according to the beam acceleration potential, and the accelerated GCIB is irradiated onto at least a portion of the substrate according to the beam dose. By doing so, the thin film is grown on the irradiated portion of the substrate to achieve the thickness and the surface roughness. For example, when growing a $SiO_2$ thin film, a beam acceleration potential of about 10 kV and a beam dose of about $2 \times 10^{14}$ clusters per $cm^2$ can achieve a film thickness of about 140 angstroms and a surface roughness of about 8 angstroms or less. In one embodiment, the beam energy distribution function for the GCIB is modified to change said thickness of said thin film, or said surface roughness of said thin film, or both. As an example, one may broaden the beam energy distribution to decrease the surface roughness of the thin film, or one may narrow the beam energy distribution to increase the surface roughness of the thin film.

Additionally, as shown in FIG. 1B, the formation of dielectric layer 1114 in trench 1112 may be directional. For example, material growth may proceed on one or more surfaces that are substantially perpendicular to the incident GCIB while material growth may be substantially avoided or reduced on one or more surfaces that are substantially parallel with the incident GCIB. However, the directionality of the film growth may be adjusted such that some growth occurs on one or more surfaces that are substantially parallel with the incident GCIB, e.g., the sidewalls 1112B of trench 1112.

For example, as the GCIB energy (or beam acceleration potential) is increased or decreased, the anisotropy (or directionality) of the GCIB may be increased or decreased, respectively. Therefore, by adjusting the beam acceleration potential, an amount of the thin film grown or deposited on the sidewalls 1112B of trench 1112 relative to the bottom 1112A of trench 1112 may be varied. Alternatively, for example, adjusting the orientation of the substrate relative to the direction of incidence of the GCIB may permit growth to proceed on other surfaces. Alternatively yet, adjusting the GCIB energy distribution (i.e., broadening or narrowing) may permit growth to proceed on other surfaces.

Moreover, one or more properties of the GCIB, including the beam composition, can be adjusted or alternated in order to directionally grade the growth of multi-layer material films having differing properties from one sub-layer to an adjacent sub-layer on one or more surfaces substantially perpendicular to the incident GCIB.

Figure 1C:
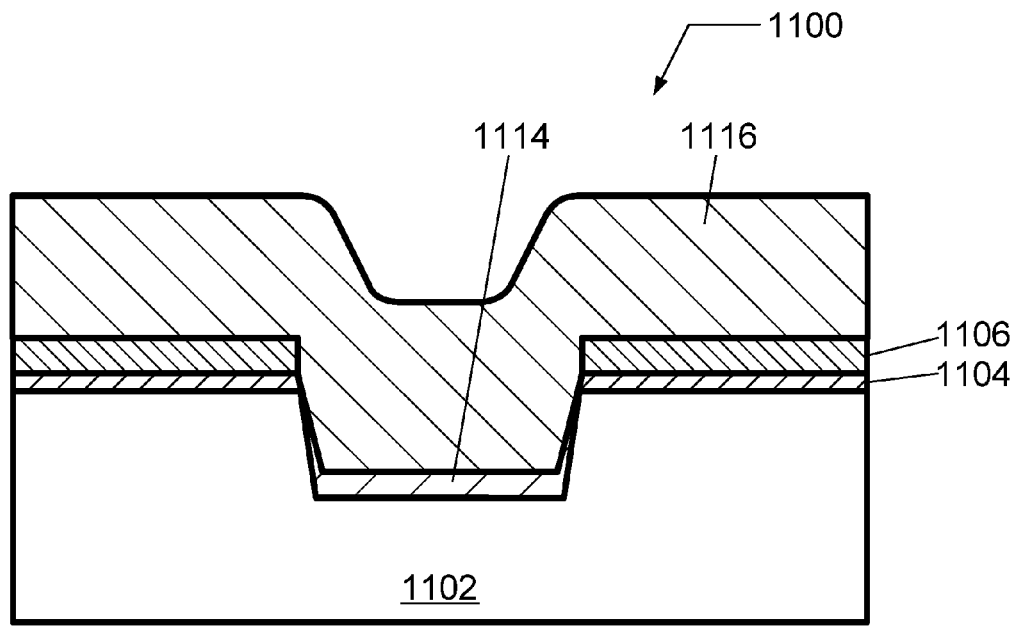

Referring to FIG. 1C, a cross-sectional view of an exemplary portion of the STI structure depicted in FIG. 1B is shown after at least partially filling trench 1112 with a second dielectric layer 1116. Second dielectric layer 1116 may be formed of a doped or un-doped silicon oxide (e.g., $SiO_2$). Some un-doped silicon oxides include thermal TEOS (tetraethyl orthosilicate) and high-density plasma (HDP) silicon oxides. Some doped silicon oxides include PSG (phosphosilicate glass), BSG (borosilicate glass), BPSG (borophosphosilicate glass), B-TEOS (boron-doped TEOS), P-TEOS (phosphorous-doped TEOS), F-TEOS (fluorinated TEOS), silicon germanium oxide, and the like. For example, PECVD may be used to deposit the dielectric material to fill trench 1112 and form second dielectric layer 1116.

Figure 1D:
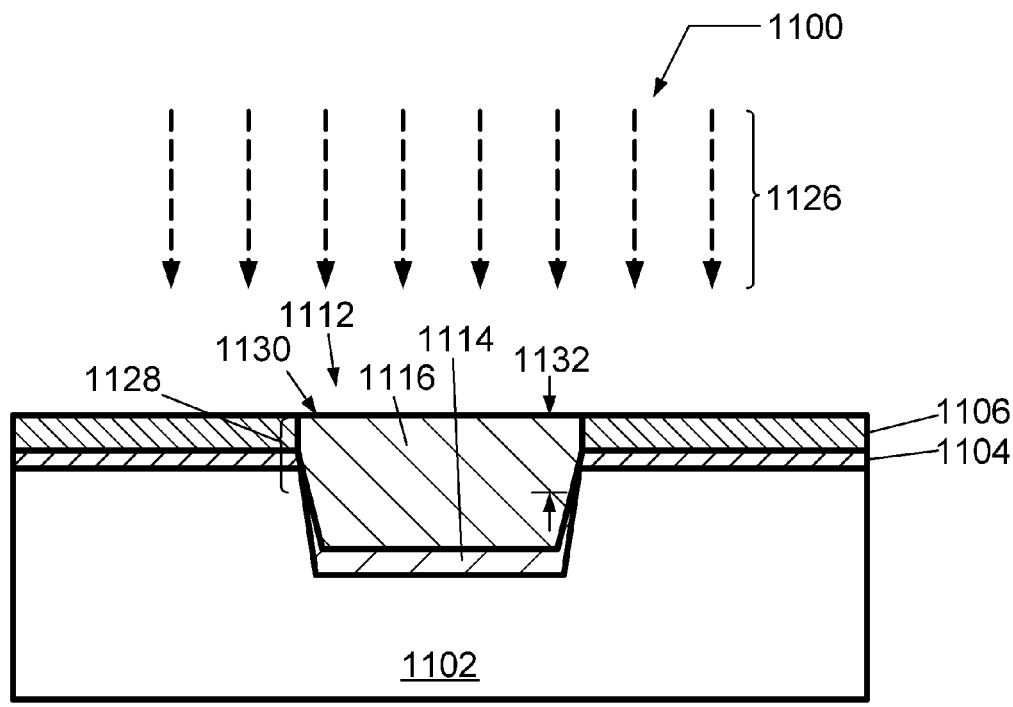

Referring to FIG. 1D, the STI structure 1100 depicted in FIG. 1C may be subjected to various planarization techniques to planarize the second dielectric layer 1116 down to the stop layer 1106. The planarization technique may include a mechanical planarization technique, such as chemical-mechanical planarization (CMP), or ion beam etching, such as GCIB planarizing or etching.

Referring still to FIG. 1D, the STI structure 1100 is irradiated by a second GCIB 1126 to introduce one or more species in an upper portion 1128 of the second dielectric layer 1116. As used herein, an upper portion 1128 of the second dielectric layer 1116 includes an exposed surface 1130 along with a pre-determined depth 1132 of the dielectric material extending into the second dielectric layer 1116. As used herein, the one or more species that are introduced into the upper portion 1128 are delivered to the exposed surface 1130 via second GCIB 1126 in the form of energetic gas cluster ions. These gas cluster ions are formed, as described above, via the expansion of a high pressure gas into a vacuum and the subsequent (electron impact) ionization of the resulting gas clusters.

According to one embodiment, the pre-determined depth 1132 may range from about 30 nm to about 80 nm. Alternatively, or in addition, the one or more species may be introduced or infused at the surface 1130 of the second dielectric layer 1116 to a depth at least as great as the depth of the stop layer 1106 and the pad oxide 1104. More generally, the pre-determined depth 1132 of the introduced species that are infused into the second dielectric layer 1116 may be in the range of about 3% to about 80% the depth of the trench 1112. In one example, the introduced species are infused to a depth in the range of about 10% to about 40% the depth of the trench 1112. The introduced species infused in the upper portion 1128 of the second dielectric layer 1116 may also have a gradation of species concentration that decreases as the distance from the surface 1130 into the trench 1112 increases.

Examples of suitable feed gas that may be introduced to produce the GCIB include one or more gaseous species containing $O_2$, $N_2$, Xe, Ar, Si, $BF_2$, or Ge, or any combination of two or more thereof. Additionally, examples of suitable feed gas that may be introduced to produce the GCIB include one or more gaseous species containing O, N, C, H, S, Si, Ge, F, Cl, Br, He, Ne, Xe, Ar, B, P, or As, or any combination of two or more thereof. The resultant flux of the species at the surface can be expressed as a density of atoms (or molecules) per area (e.g., atoms/$cm^2$) for a given exposure time.

The second GCIB 1126 may be formed using a GCIB processing system as discussed below. The second GCIB 1126 may be formed and accelerated by an acceleration potential ranging from about 1 kV to about 70 kV. Alternatively, the acceleration potential may range from about 1 kV to about 20 kV. In one embodiment, the acceleration potential is selected based upon the desired depth of the introduced species infused into the second dielectric layer 1116. Alternatively, or in addition, the selection of the acceleration potential may be made based upon the type of layer(s) adjacent the second dielectric layer 1116.

Densification of the one or more species introduced to second dielectric layer 1116 may be performed to reduce the high wet removal (e.g., etch) rate and/or seam propagation of the second dielectric layer 1116 during post mechanical planarization wet clean processing. The densification process may be used in conjunction with standard substantially non-oxidizing anneals, and applied after the mechanical planarization cleaning step. The resulting densification may provide enough wet etch margin against STI fill recess and keyhole propagation during subsequent processing steps. In addition, the densification of the introduced species infused into second dielectric layer 1116 may be obtained at lower temperatures and less corrosive oxidizing ambient without overly reacting with the substrate materials.

The STI structure 1100 of FIG. 1D may be annealed under conditions effective to Denny the one or more species infused into the second dielectric layer 1116. Specifically, the annealing conditions employed may be selected so that the removal rate of the annealed species infused into second dielectric layer 1116 substantially matches that of the adjacent stop layer 1106. This selective annealing step may ensure that any subsequent removal process (e.g., etching) will remove the energetic species infused into second dielectric layer 1116 and the stop layer 1106 at similar rates thus preventing the formation of any isotropic defects or "divots" in the second dielectric layer 1116.

In one embodiment, annealing may be carried out in an inert gas atmosphere, e.g., nitrogen, argon, helium and the like, which may or may not be mixed with $O_2$, $N_2O$, $NO_2$, or NO. One example of an atmosphere employed in the annealing step is steam at a temperature of about 600 degrees C. to about 700 degrees C. for a time interval ranging from about 30 seconds to about 120 seconds. In an additional example, the atmosphere employed for the annealing step is steam at a temperature from about 75 degrees C. to about 600 degrees C. for a time interval ranging from about 30 seconds to about 120 seconds. It should be noted that the annealing step may be carried out in a single ramp step or it can be carried out using a series of ramp and soak cycles.

After annealing and densification of the one or more species introduced into second dielectric layer 1116, the STI structure 1100 may be subjected to a selective removal step which is highly selective in removing the stop layer 1106. Suitable oxide etching techniques that may be employed include, but are not limited to, wet etching techniques and/or dry etching techniques, such as reactive ion etching (RIE), plasma etching, ion beam etching, GCIB etching, and chemical dry etching. The gases that may be employed in these etching techniques are those that have a high affinity and selectivity for the stop layer 1106, as well as the one or more species introduced into second dielectric layer 1116.

For dry etching processes, examples of suitable gases that can be employed in the dry etching process include: $CF_4$, $SF_6$, $NF_3$, $CHF_3$, $CH_2F_2$, $C_4F_6$, $C_4F_8$, $C_5F_8$, HBr, $Cl_2$, $Br_2$, $BCl_3$, and combinations thereof. The gases may also be used in conjunction with oxygen-containing gas, carbon-containing gas, hydrogen-containing gas, nitrogen-containing gas, or an inert gas such as a noble gas. For wet etching processes, suitable chemical etchants may include, but not be limited to, HF and/or $HNO_3$.

Figure 2A:
FIGS. 2A through 2B illustrate a cross-sectional view of an exemplary portion of an STI structure according to another embodiment of the method.

Referring now to FIG. 2A, a cross-sectional view of an exemplary portion of an STI structure 1200 is shown according to another embodiment. The STI structure 1200 includes a substrate 1202 that may be a silicon-containing structure or other semiconductor substrate that includes a bulk substrate region. For ease of illustration, the figures show active areas and STI field isolation regions in a single well type. However, in general, this and other embodiments are applicable to other semiconductor device isolation regions such as n-well and p-well regions in p-type substrates, n-type substrates and epitaxial substrates, including p on p+, p on p−, n on n+, and n on n− depending on the type of semiconductor device being manufactured. In some implementations, the substrate 1202 can comprise gallium arsenide (GaAs) or other semiconductor materials including, but not limited to: Si, Ge, SiGe, GaAs, InAs, InP, CdS, CdTe, other III/V compounds, and the like.

Figure 2B:
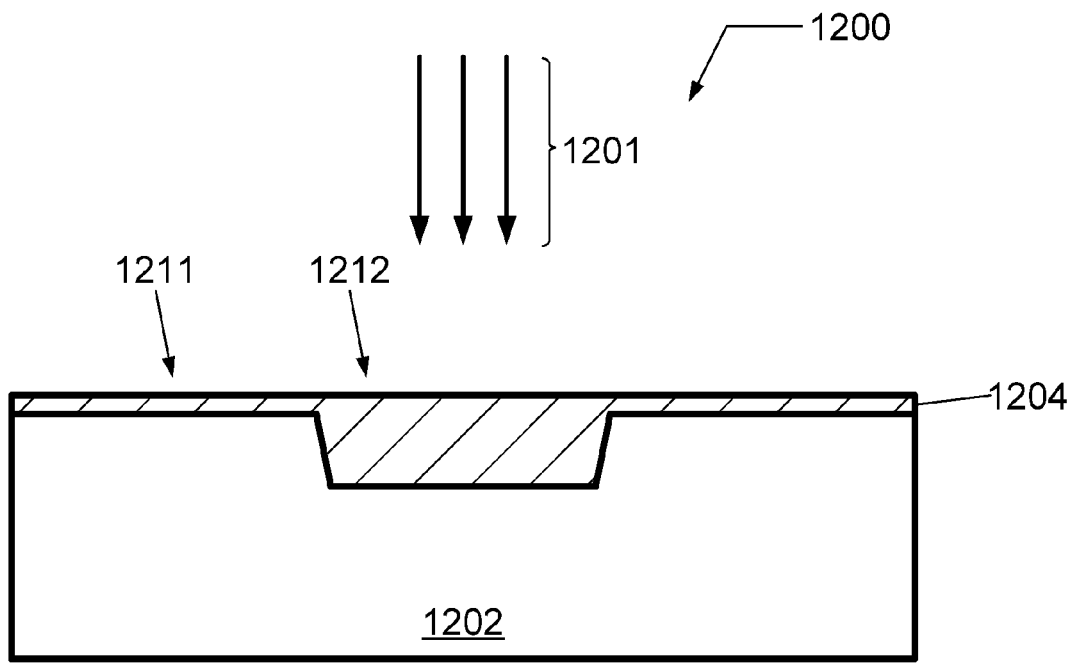

Referring to FIG. 2B, a cross-sectional view of an exemplary portion of the STI structure 1200 depicted in FIG. 2A is shown during a step of growing a dielectric layer 1204. A GCIB 1201 is generated, and the substrate 1202, or one or more layers on the substrate 1202, is irradiated with the GCIB 1201 to form dielectric layer 1204. The GCIB 1201 is used to grow dielectric layer 1204 in at least one region on the substrate 1202 to a pre-determined depth. The dielectric layer 1204 comprises a first region 1211 having a shallow penetration depth that may serve as a pad oxide layer, and the dielectric layer 1204 comprises a second region 1212 having a relatively deeper penetration depth that may serve as trench isolation. Alternatively, the dielectric layer 1204 is grown in the second region 1212 and is not grown in the first region 1211.

The dielectric layer 1204 may comprise an oxide, such as $SiO_2$ or more generally $SiO_x$. Alternatively, the dielectric layer 1204 may comprise a nitride, such as $SiN_x$ or the dielectric layer 1204 may comprise an oxynitride, such as $SiO_xN_y$. When the substrate 1202, or the irradiated layer or layers on substrate 1202, comprises silicon, $SiO_2$, $SiN_x$, or $SiO_xN_y$ may be grown via a GCIB generated using an oxygen-containing gas and/or a nitrogen-containing gas, such as $O_2$, $N_2$, $N_2O$, $NO_2$, or NO. Additional details for growing a thin film or layer, using, for example, an oxidation process, are provided in co-pending U.S. patent application Ser. No. 12/144,968, entitled METHOD AND SYSTEM FOR GROWING A THIN FILM USING A GAS CLUSTER ION BEAM, the entire content of which is herein incorporated by reference in its entirety.

According to one embodiment, the variation of the penetration depth between the first region 1211 and the second region 1212 is achieved by varying the GCIB dose (e.g., time and/or beam current) or the GCIB energy (e.g., GCIB acceleration potential), or both. According to another embodiment, this variation in penetration depth may be achieved by forming one or more mask layers (not shown) on substrate 1202 having a pattern created therein that is approximately aligned with the second region 1212, exposing the substrate 1202 to a first GCIB oxidation process configured to produce a relatively deeper penetration depth for the grown dielectric layer in the second region 1212, removing the one or more mask layers, and exposing the substrate 1202 to a second GCIB oxidation process configured to produce a relatively shallower penetration depth for the grown dielectric layer in the first region 1211.

The GCIB 1201 may be formed using a GCIB processing system as discussed below. The GCIB 1201 may be formed and accelerated by an acceleration potential ranging from about 1 kV to about 70 kV. Alternatively, the acceleration potential may range from about 1 kV to about 20 kV. In one embodiment, the acceleration potential is selected based upon the desired depth for the dielectric layer 1204. Alternatively, or in addition, the selection of the acceleration potential may be made based upon the type of layer(s) adjacent the dielectric layer 1204.

Dielectric layer 1204 may be modified by infusing one or more atomic or molecular species, by densification, or by annealing, or any combination of two or more thereof.

Figure 3A:
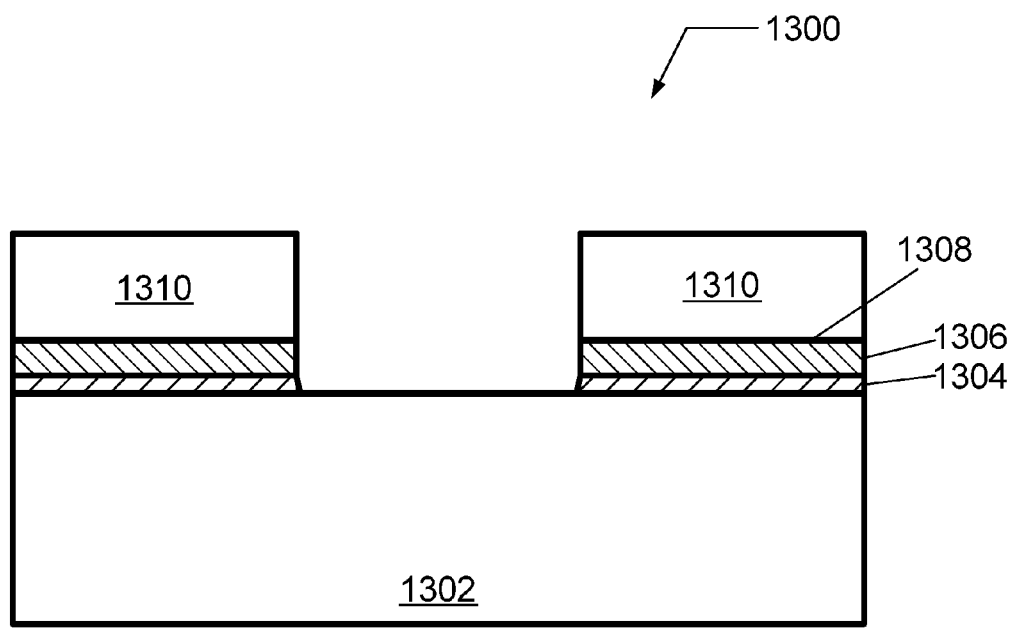
FIGS. 3A through 3B illustrate a cross-sectional view of an exemplary portion of an STI structure according to yet another embodiment of the method.

Referring to FIG. 3A, a cross-sectional view of an exemplary portion of an STI structure 1300 is shown according to an embodiment. The STI structure 1300 includes a substrate 1302 that may be a silicon-containing structure or other semiconductor substrate that includes a bulk substrate region. For ease of illustration, the figures show active areas and STI field isolation regions in a single well type. However, in general, this and other embodiments are applicable to other semiconductor device isolation regions such as n-well and p-well regions in p-type substrates, n-type substrates and epitaxial substrates, including p on p+, p on p−, n on n+, and n on n− depending on the type of semiconductor device being manufactured. In some implementations, the substrate 1302 can comprise gallium arsenide (GaAs) or other semiconductor materials including, but not limited to: Si, Ge, SiGe, GaAs, InAs, InP, CdS, CdTe, other III/V compounds, and the like.

A layer of a pad oxide 1304, such as $SiO_2$, can be provided atop the substrate 1302, for example, either by deposition or by oxidizing process(es). In the latter, oxidation may include heating the substrate 1302 in an oxygen ambient at high temperature (e.g., 800 degrees C. to about 1100 degrees C.) until the oxide is formed on the surface of the substrate 1302. It is also possible to form pad oxide layer 1304 by conventional deposition processes such as, but not limited to: chemical vapor deposition (CVD), plasma-enhanced CVD (PECVD), or physical vapor deposition (PVD). Further, it is possible to form pad oxide layer 1304 using a GCIB to perform an oxidation process and grow the pad oxide layer 1304.

An optional stop layer 1306, such as a nitride (e.g., $SiN_x$) layer, a carbide (e.g., $SiC_x$) layer, an oxynitride (e.g., $SiO_xN_y$) layer, a carbonitride (e.g., $SiC_xN_y$) layer, or other dielectric layer, which resists erosion during subsequent planarization and etching, may be provided over the pad oxide layer 1304 and may define an outer surface 1308. A mask 1310, such as a layer of photoresist, then is deposited and patterned as shown. The mask 1310 can be patterned by conventional photolithographic techniques. Other materials and additional layers may also be used to form the mask 1310 without departing from these and other embodiments.

Mask 1310 is patterned to expose regions for growing a dielectric layer 1312 in substrate 1302. By substrate, it is meant to include any semiconductor layer, and by substrate assembly, it is meant to include any substrate having one or more layers formed thereon or doped regions formed therein.

The stop layer 1306 and the pad oxide layer 1304 exposed through the mask 1310 can then be removed. Suitable techniques for patterning these layers include, but are not limited to, dry etching techniques and wet etching techniques. Dry etching techniques may include dry etching, wet etching, dry plasma etching, ion beam etching, GCIB etching, etc. The mask 1310 may then be removed by wet or dry stripping of the photoresist using conventional techniques.

Figure 3B:
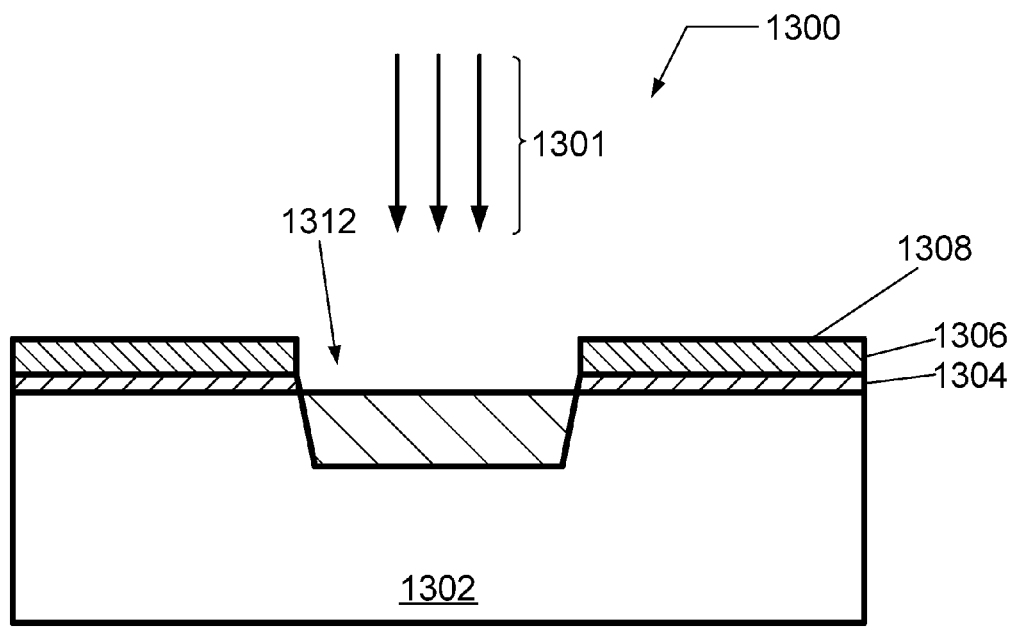

Referring to FIG. 3B, a cross-sectional view of an exemplary portion of the STI structure 1300 depicted in FIG. 3A is shown during a step of growing a dielectric layer 1312. A GCIB 1301 is generated, and the substrate 1302, or one or more layers on the substrate 1302, is irradiated with the GCIB 1301 to form dielectric layer 1312. The GCIB 1301 is used to grow dielectric layer 1312 in at least one region on the substrate 1302 to a pre-determined depth. The dielectric layer 1312 may comprise an oxide, such as $SiO_2$. Alternatively, the dielectric layer 1312 may comprise a nitride, such as $SiN_x$ or the dielectric layer 1312 may comprise an oxynitride, such as $SiO_xN_y$. When the substrate 1302, or the irradiated layer or layers on substrate 1302, comprises silicon, $SiO_2$ may be grown via GCIB 1301 using an oxygen-containing gas, such as $O_2$. Additional details for growing a thin film or layer, using, for example, an oxidation process, are provided in co-pending U.S. patent application Ser. No. 12/144,968, entitled METHOD AND SYSTEM FOR GROWING A THIN FILM USING A GAS CLUSTER ION BEAM, the entire content of which is herein incorporated by reference in its entirety.

The GCIB 1301 may be formed using a GCIB processing system as discussed below. The GCIB 1301 may be formed and accelerated by an acceleration potential ranging from about 1 kV to about 70 kV. Alternatively, the acceleration potential may range from about 1 kV to about 20 kV. In one embodiment, the acceleration potential is selected based upon the desired depth for the dielectric layer 1312. Alternatively, or in addition, the selection of the acceleration potential may be made based upon the type of layer(s) adjacent the dielectric layer 1312.

Dielectric layer 1312 may be modified by infusing one or more atomic or molecular species, by densification, or by annealing, or any combination of two or more thereof.

Additional processes can be performed using known techniques to complete an integrated circuit (IC) for use in an electronic system that includes a controller (e.g., a processor) and active semiconductor regions separated by the STI structure, wherein the STI structure includes a dielectric trench having a dielectric liner formed by growing the dielectric liner on the semiconductor substrate using a GCIB. Various types of devices may be formed in the active areas. Such devices include imaging devices, memory devices or logic devices. For example, the completed IC may include an array of memory cells for a DRAM or other memory device. In other ICs, logic devices for gate arrays, microprocessors or digital signal processors may be formed in the active regions. The STI structure 1100, 1200, 1300 may separate the active regions from one another.

Other embodiments further include an integrated circuit, methods of forming the integrated circuit, memory devices, and electronic systems that include the memory devices, having a plurality of active regions in a first region of a semiconductor substrate that are separated by STI structures. As discussed herein, dielectric trenches separating at least two of the active regions from one another may include dielectric liners formed by growing the dielectric liners on the semiconductor substrate using a GCIB.

Figure 4:
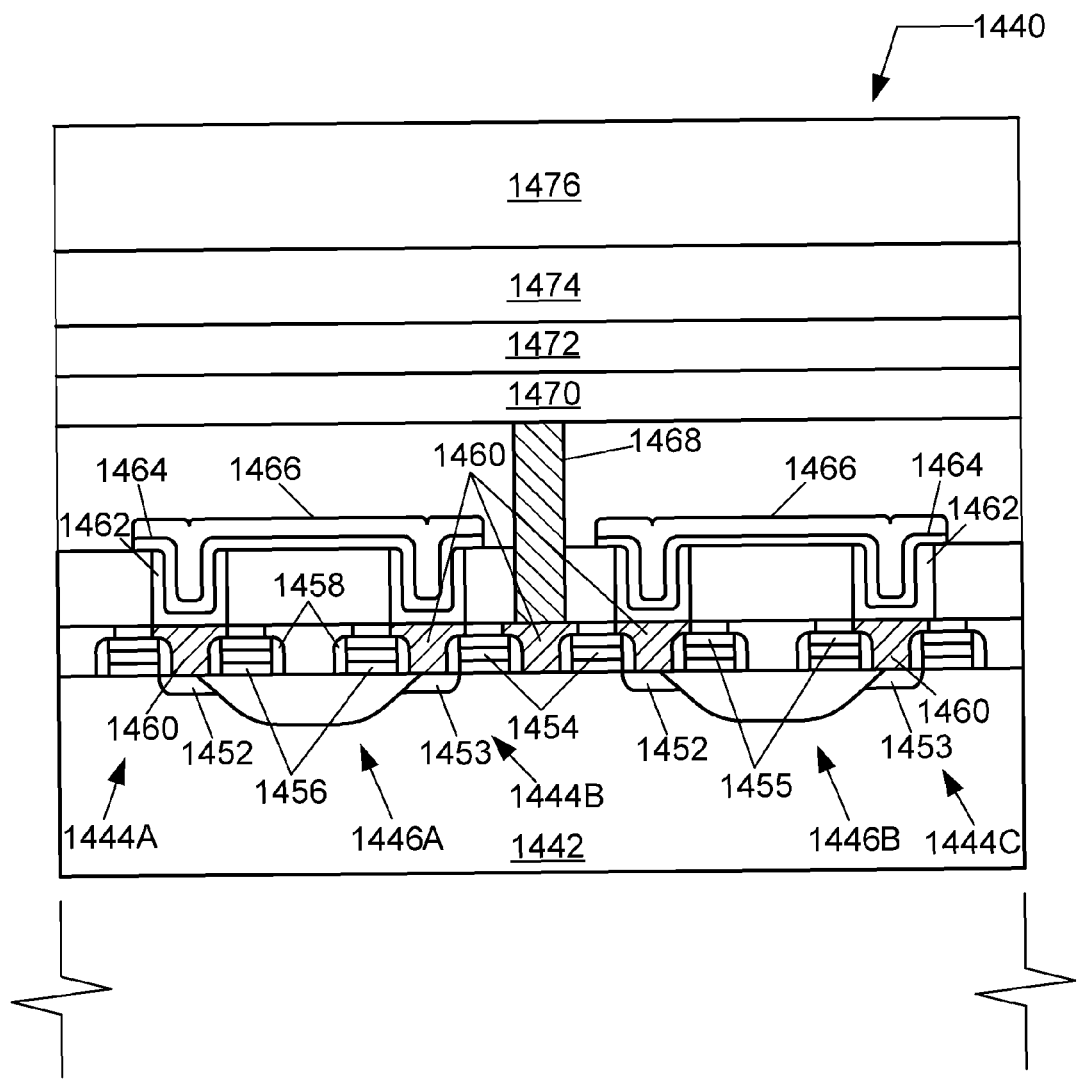
FIG. 4 is a cross-sectional view of an exemplary integrated circuit that includes STI structures separating active regions according to another embodiment.

As discussed herein, one or more species are then directed at an upper surface of the substrate using a GCIB after at least partially filling the trenches with the dielectric material. In one embodiment, ionized gas clusters containing the one or more species are infused at a depth of about 30 nm to about 80 nm below the surface of the dielectric material. The dielectric material filling the trench may also include a seam, as discussed herein. Upon densification, the one or more species infused into a surface of the dielectric material may provide for uniform wet etch rates across the surface of the dielectric material, including the seam. FIG. 4 illustrates portions of exemplary integrated circuits that include STI structures separating active regions. The STI structures may be formed using the techniques described above.

In FIG. 4, a stacked-cell DRAM 1440 includes a semiconductor substrate 1442 with multiple active regions 1444A, 1444B, 1444C separated by STI regions 1446A, 1446B. Each isolation region 1446A, 1446B includes the dielectric layer formed according to embodiments described above.

Impurity-doped regions 1452, 1453 may be formed, for example, by a diffusion implanted or infused process with the regions 1452 serving as storage nodes (e.g., source and drain) for memory cells of the DRAM and the regions 1453 serving as contact nodes. Stacked gates are provided over the gate oxide layers 1456 with nitride or other spacers 1458 provided on either side of the gates. The stacked gates include a polysilicon layer 1454 and an insulating layer 1455. The insulating layer 1455 may include, for example, a deposited oxide, a deposited nitride, or a composite stack of oxide/nitride or oxide/nitride/oxide layers. In some implementations, each gate stack also includes a silicide layer between the polysilicon layer 1454 and the insulating layer 1455. The silicide layer may include, for example, a tungsten silicide, a titanium silicide or a cobalt silicide. In yet other implementations, the gate stack includes a barrier metal layer and a metal layer between the polysilicon layer 1454 and the insulating layer 1455. Suitable barrier metal layers include tungsten nitride, titanium nitride and tantalum nitride. The metal layer may include tungsten, tungsten silicide, titanium silicide, or cobalt silicide. Polysilicon plugs 1460 form the contacts to the regions 1452.

In the illustrated IC of FIG. 4, capacitor cells comprise lower storage node electrodes 1462, a cell dielectric 1464 and an upper electrode 1466. A metal contact 1468 provides the electrical connection between one of the polysilicon plugs 1460, which serves as the bit line, and a first metallization layer 1470. An insulating layer 1472 separates the first metallization layer 1470 from a second metallization layer 1474. The entire semiconductor wafer is covered by a passivation layer 1476.

Although FIG. 4 illustrates a stacked-cell DRAM, isolation regions formed according to the techniques described above can be incorporated into any other type of memory such as trench cell DRAMs, flash memory, embedded memory, electrically erasable programmable read only memory (EEPROM), and the like.

As described above, one or more dielectric layers in one or more regions on a substrate may be grown by generating a GCIB in a GCIB processing system and irradiating the substrate with the GCIB. The GCIB may be used to grow a dielectric film or grow a trench liner prior to depositing the dielectric material. For example, a GCIB containing $O_2$ may be used to grow $SiO_2$ on silicon. Additionally, a second GCIB may be used to introduce one or more species to a dielectric material. Furthermore, a third GCIB may be used to planarize the deposited dielectric material. For example, a GCIB containing $CF_4$, $NF_3$, or $SF_6$ may be used to planarize the dielectric material. Additionally yet, a fourth GCIB may be used to etch the dielectric material, the stop layer, or both the dielectric material and the stop layer. For example, a GCIB containing $CF_4$, $NF_3$, or $SF_6$ may be used to etch the dielectric material or stop layer. Further yet, a fifth GCIB may be used to form the trench. For example, a GCIB containing $NF_3$ or $SF_6$ may be used to etch a trench or via in silicon.

Figure 5:
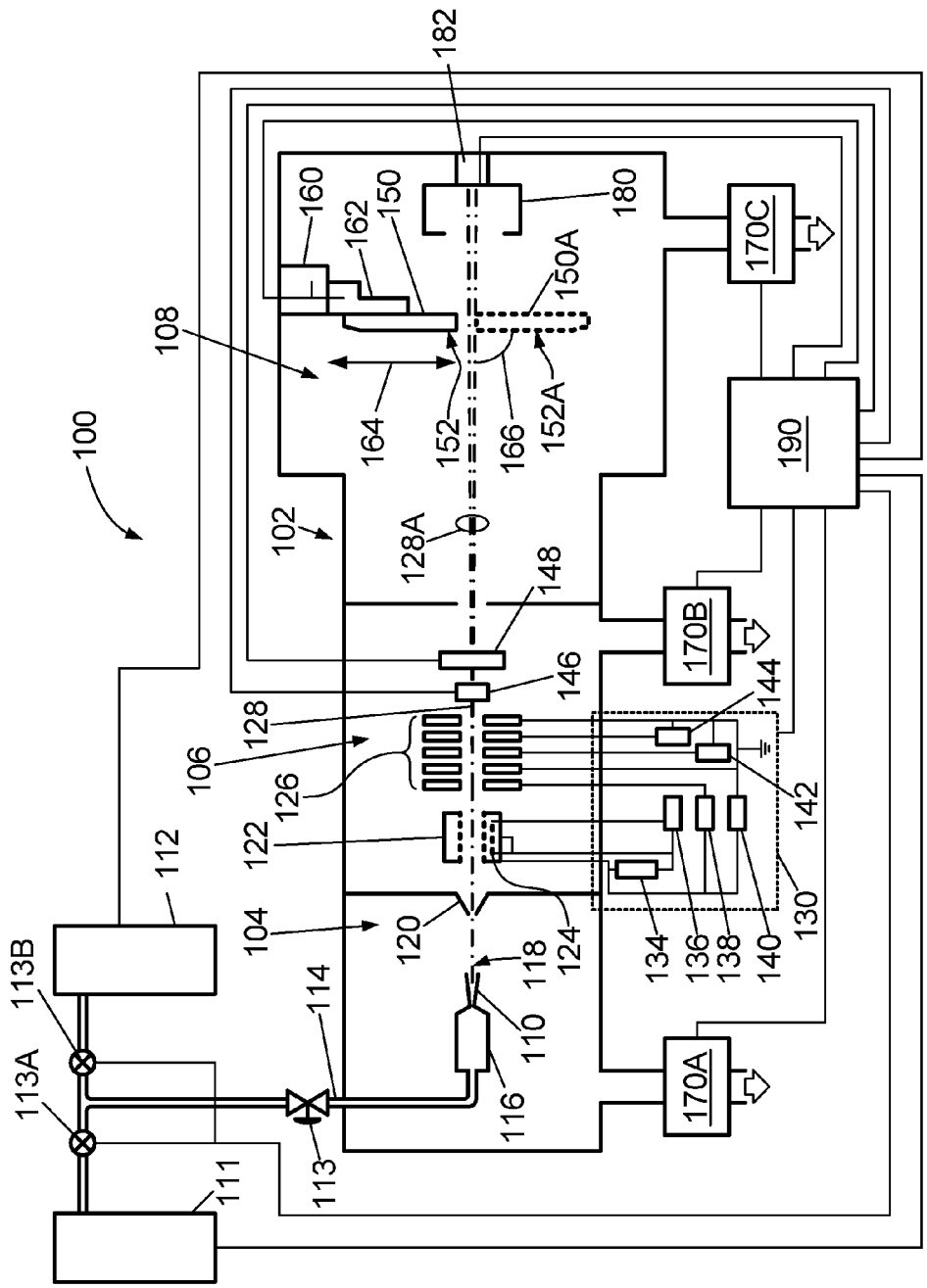
FIG. 5 is an illustration of a GCIB processing system.

According to an embodiment, a GCIB processing system 100 for, among other things, generating the GCIB for growing a dielectric material layer is depicted in FIG. 5. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 5, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and optionally accelerated. Then in the third chamber (processing chamber 108), the accelerated or non-accelerated GCIB may be utilized to treat substrate 152.

As shown in FIG. 5, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Furthermore, for example, the first gas composition or the second gas composition or both can comprise a gas composition containing one or more species for growing the dielectric material or for infusion into the dielectric material. Further yet, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn. Furthermore, the first gas source 111 and the second gas source 112 may be utilized either alone or in combination with one another to produce ionized clusters.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 5, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 70 keV.

As illustrated in FIG. 5, the beam electronics 130 further include an anode power supply 134 that provides voltage $V_A$ to an anode of ionizer 122 for accelerating electrons emitted from filament 124 and causing the electrons to bombard the gas clusters in gas cluster beam 118, which produces cluster ions.

Additionally, as illustrated in FIG. 5, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{Acc}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 5, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 1, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 5, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 6:
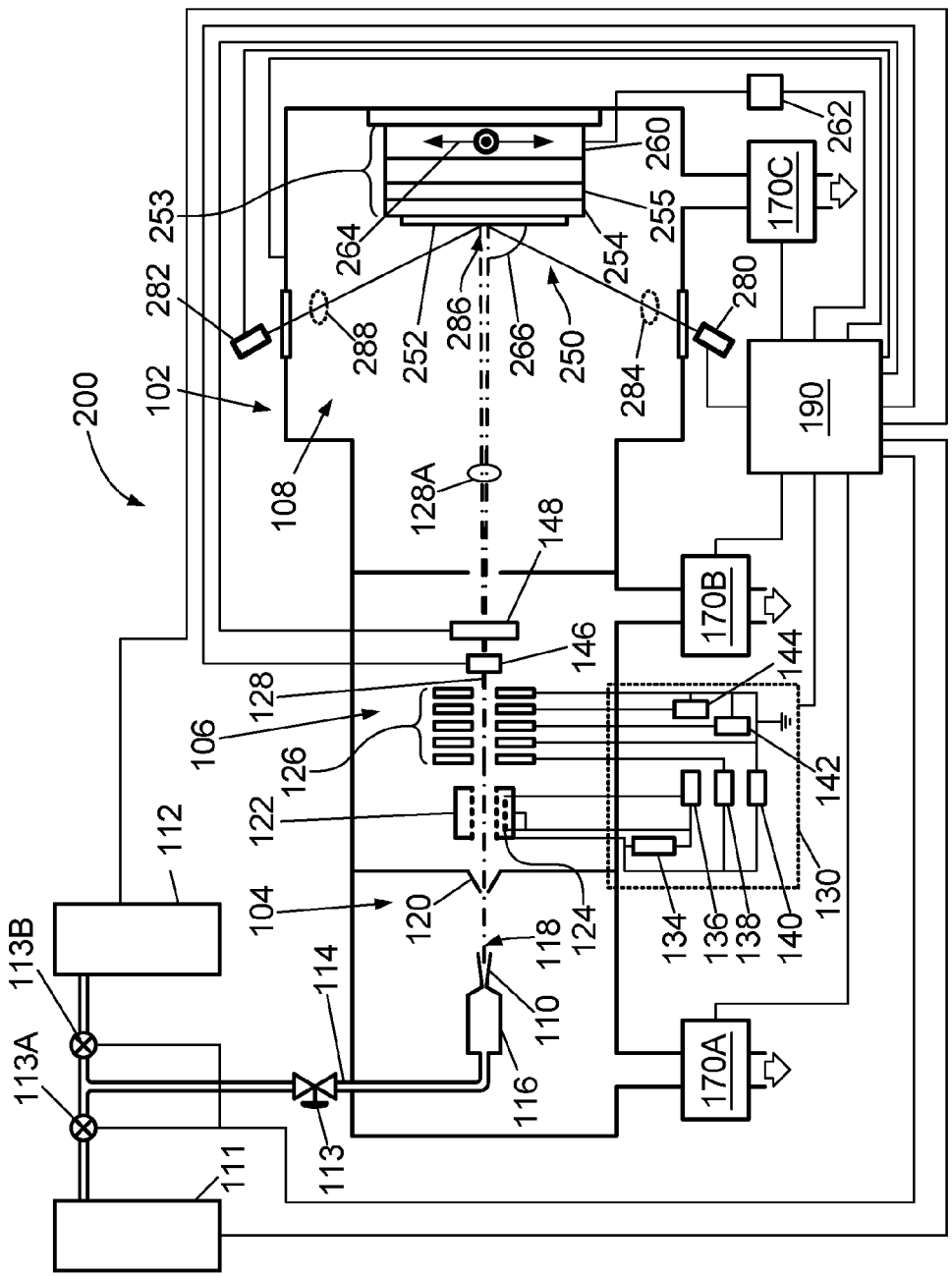
FIG. 6 is another illustration of a GCIB processing system.

In the embodiment shown in FIG. 6, the GCIB processing system 200 can be similar to the embodiment of FIG. 5 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the substrate 252 surface. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 5) may be used to assure accurate dosimetry despite the added source of electrical charge the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a pre-determined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 200 by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 200. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Control system 190 comprises a microprocessor, memory, and a digital I/O port capable of generating control voltages sufficient to communicate and activate inputs to GCIB processing system 100 (or 200) a as well as monitor outputs from GCIB processing system 100 (or 200). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 200), or it can be remotely located relative to the GCIB processing system 100 (or 200). For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 7:
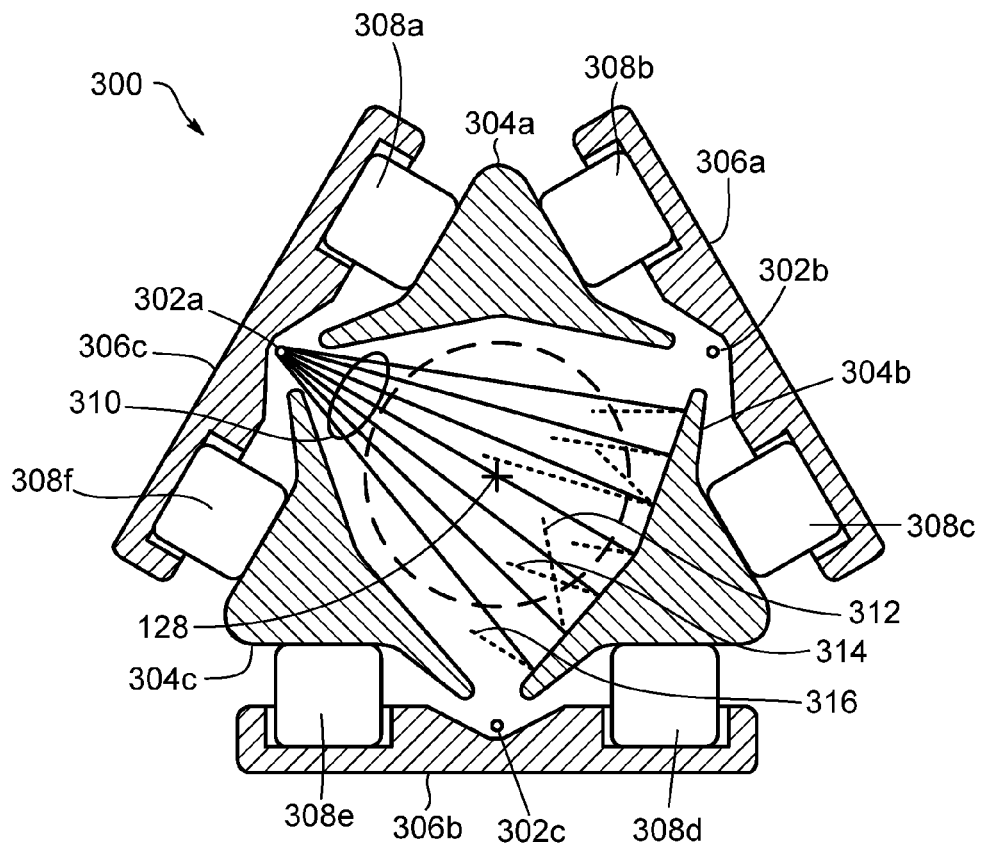
FIG. 7 is an illustration of an ionization source for a GCIB processing system.

Referring now to FIG. 7, a section 300 of a gas cluster ionizer (122, FIGS. 5 and 6) for ionizing a gas cluster jet (gas cluster beam 118, FIGS. 5 and 6) is shown. The section 300 is normal to the axis of GCIB 128. For typical gas cluster sizes (2000 to 15000 atoms), clusters leaving the skimmer aperture (120, FIGS. 5 and 6) and entering an ionizer (122, FIGS. 5 and 6) will travel with a kinetic energy of about 130 to 1000 electron volts (eV). At these low energies, any departure from space charge neutrality within the ionizer 122 will result in a rapid dispersion of the jet with a significant loss of beam current. FIG. 7 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Alternatively, ionizers may use electron extraction from plasma to ionize clusters. The geometry of these ionizers is quite different from the three filament ionizer described here but the principles of operation and the ionizer control are very similar.

Figure 8:
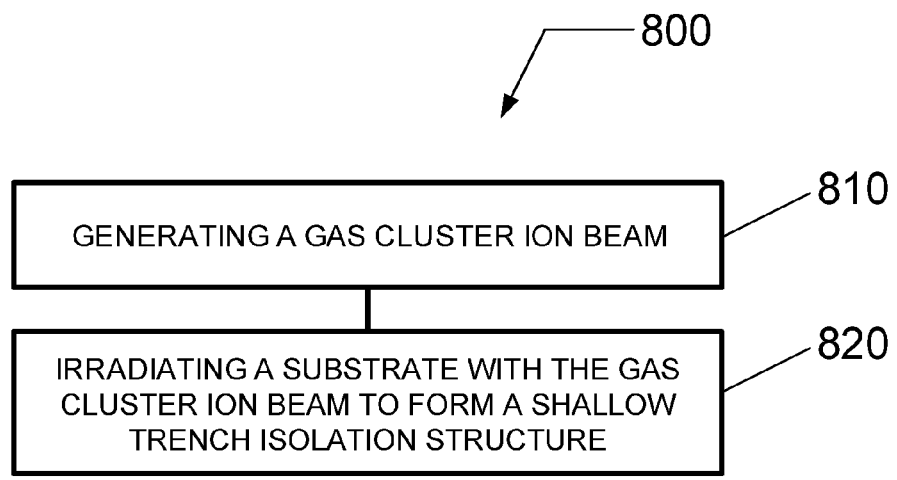
FIG. 8 is a flowchart illustrating a method of forming an STI structure on a substrate according to yet another embodiment.

Referring to FIG. 8, a method of forming shallow trench isolation on a substrate using a GCIB is illustrated according to an embodiment. The method comprises a flow chart 800 beginning in 810 with generating a GCIB in a GCIB processing system. As described above, a pressurized gas is expanded into a reduced pressure environment to form gas clusters, the gas clusters are ionized, the ionized gas clusters are accelerated and optionally filtered.

The GCIB may be formed and accelerated by an acceleration potential ranging from about 1 kV to about 70 kV. Alternatively, the acceleration potential may range from about 1 kV to about 20 kV. In one embodiment, the acceleration potential is selected based upon the desired depth for the dielectric layer. Alternatively, or in addition, the selection of the acceleration potential may be made based upon the type of layer(s) adjacent the dielectric layer.

The GCIB processing system can be any of the GCIB processing systems (100 or 200) described above in FIG. 5 or 6, or any combination thereof. A substrate can be positioned on a substrate holder in the GCIB processing system and may be securely held by the substrate holder. The temperature of the substrate may or may not be controlled. For example, the substrate may be heated or cooled during a growth process. The environment surrounding the substrate is maintained at a reduced pressure, while the GCIB is formed from a pressurized gas mixture comprising one or more film forming species.

The substrate can include a conductive material, a non-conductive material, or a semi-conductive material, or a combination of two or more materials thereof. Additionally, the substrate may include one or more material structures formed thereon, or the substrate may be a blanket substrate free of material structures.

In 820, the substrate is irradiated with the GCIB to form an STI structure by growing a dielectric layer in at least one region on the substrate. The GCIB is used to grow the dielectric layer in at least one region on the substrate to a predetermined depth. When the substrate, or the irradiated layer or layers on the substrate, comprises silicon, $SiO_2$ may be grown via the GCIB by using an oxygen-containing gas, such as $O_2$.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of forming a shallow trench isolation (STI) structure on a substrate, comprising:
   forming a trench on said substrate;
   growing a dielectric liner on at least one surface within said trench by performing the following:
      generating a gas cluster ion beam (GCIB),
      selecting a beam acceleration potential and a beam dose to achieve a thickness of said dielectric liner and to achieve a surface roughness of an exposed surface of said dielectric liner less than approximately 20 angstroms, and
      irradiating said trench with said GCIB to grow said dielectric liner on said at least one surface within said trench; and
   thereafter, filling said trench at least partially with additional dielectric material to form said STI structure.

2. The method of claim 1, wherein said growing said dielectric liner comprises oxidizing said at least one surface within said trench to form an oxide layer, or nitriding said at least one surface within said trench to form a nitride layer, or both oxidizing and nitriding said at least one surface within said trench to form an oxynitride layer.

3. The method of claim 2, wherein said GCIB comprises one or more gases selected from the group consisting of $O_2$, $N_2$, $N_2O$, $NO_2$, and NO, and an optional inert gas.

4. The method of claim 2, wherein said oxide layer comprises $SiO_2$, or said nitride layer comprises $SiN_x$, or said oxynitride layer comprises $SiO_xN_y$.

5. The method of claim 1,
wherein irradiating said trench with said GCIB forms said dielectric liner on a bottom surface of said trench while substantially avoiding growth of said dielectric liner on sidewalls of said trench.

6. The method of claim 5, wherein said irradiating said trench comprises oxidizing said bottom surface of said trench.

7. The method of claim 1, further comprising:
planarizing said additional dielectric material.

8. The method of claim 1, further comprising:
treating said additional dielectric material to correct a seam formed in said additional dielectric material.

9. The method of claim 1, further comprising:
annealing said dielectric liner.

10. The method of claim 1, further comprising:
generating another GCIB; and
irradiating said dielectric liner with said another GCIB to introduce one or more species into said dielectric liner to a pre-determined depth.

11. The method of claim 10, wherein said introducing said one or more species comprises introducing $O_2$, $N_2$, Xe, Ar, Si, $BF_2$, or Ge, or any combination of two or more thereof.

12. The method of claim 10, wherein said introducing said one or more species comprises introducing O, N, C, H, S, Si, Ge, F, Cl, Br, He, Ne, Xe, Ar, B, P, or As, or any combination of two or more thereof.

13. The method of claim 10, further comprising:
annealing said dielectric liner with said one or more species following said irradiating with said another GCIB.

14. The method of claim 1, further comprising:
using said STI structure in a memory device.

15. The method of claim 1, further comprising:
modifying a beam energy distribution of said GCIB to achieve said surface roughness.

16. The method of claim 15, wherein said modifying achieves a surface roughness less than 8 angstroms.

17. A method of forming a shallow trench isolation (STI) structure on a substrate, comprising:
forming a trench on said substrate;
growing a dielectric liner on a bottom surface within said trench by performing the following:
generating a gas cluster ion beam (GCIB),
adjusting a directionality of said GCIB, and
irradiating said trench with said GCIB to directionally grow said dielectric liner on said bottom surface within said trench while substantially avoiding growth of said dielectric liner on sidewalls of said trench; and
thereafter, filling said trench at least partially with additional dielectric material to form said STI structure.

18. The method of claim 17, further comprising:
modifying a beam energy distribution of said GCIB to achieve a surface roughness of an exposed surface of said dielectric liner less than approximately 20 angstroms.

19. The method of claim 18, wherein said growing said dielectric liner comprises oxidizing said bottom surface to form an oxide layer, or nitriding said bottom surface to form a nitride layer, or both oxidizing and nitriding said bottom surface to form an oxynitride layer.

* * * * *

UNITED STATES PATENT AND TRADEMARK OFFICE
CERTIFICATE OF CORRECTION

| | | |
|---|---|---|
| PATENT NO. | : 7,968,422 B2 | Page 1 of 1 |
| APPLICATION NO. | : 12/367697 | |
| DATED | : June 28, 2011 | |
| INVENTOR(S) | : John J. Hautala | |

It is certified that error appears in the above-identified patent and that said Letters Patent is hereby corrected as shown below:

IN THE SPECIFICATIONS:

Column 1, line 54, "heated to Denny" should read --heated to densify--.

Column 8, line 23, "effective to Denny" should read --effective to densify--.

Signed and Sealed this
Thirteenth Day of September, 2011

David J. Kappos
*Director of the United States Patent and Trademark Office*